United States Patent

[11] 3,562,548

[72] Inventor Dietrich Armgarth
Dresden, Germany
[21] Appl. No. 719,121
[22] Filed Apr. 5, 1968
[45] Patented Feb. 9, 1971
[73] Assignee Arbeitsstelle Fur Molekularelektronik
Dresden, Germany

[54] CIRCUIT ARRANGEMENT WITH SEMICONDUCTOR ELEMENTS
5 Claims, 2 Drawing Figs.

[52] U.S. Cl. .......... 307/214, 307/218, 307/254, 307/299, 307/303; 317/235; 328/95, 328/96
[51] Int. Cl. .......... H03k 19/40
[50] Field of Search .......... 307/214, 215, 218, 254, 299a, 303; 317/235/22, 235/40.12, 235/40.13; 328/95, 96

[56] References Cited
UNITED STATES PATENTS

| | | | |
|---|---|---|---|
| 3,378,695 | 4/1968 | Marette | 307/218X |
| 3,416,043 | 12/1968 | Jorgensen | 317/235/22X |

*Primary Examiner*—Donald D. Forrer
*Assistant Examiner*—R.C. Woodbridge
*Attorney*—Nolte and Nolte

ABSTRACT: A switching circuit for performing logic operations in which the collector electrodes of a plurality of input transistors are joined into a nodal point and the emitter electrodes are connected in parallel while the base electrodes serve as separate inputs. The nodal point is then connected to the collector electrode of an inversely operated multiemitter transistor, the base electrode of which is returned to a source of potential while the emitter electrodes thereof form output terminals.

INVENTOR
DIETRICH ARMGARTH

CIRCUIT ARRANGEMENT WITH SEMICONDUCTOR ELEMENTS

BACKGROUND OF THE INVENTION

1. Field of the Invention

The present invention relates to a circuit arrangement having semiconductor structural elements therein and which is adapted to perform logic operations and is in the form of a semiconductor chip.

2. Description of the Prior Art

There is a great number of circuit arrangements known in the field of logic operations which employ transistors in parallel and with common emitter operation and in which the base of each transistor is driven by a signal over an input resistance and the supply voltage of which is fed through a common resistor while the output circuits are joined to the collectors.

Such circuit arrangements operate unsatisfactorily as regards to their dynamic behavior since parasitic capacitances are associated with each structural element. There are also current hogging effects present in logic systems which are caused mainly by one of the transistors. The number of the structural elements and the structural regions of the elements is still too numerous. In order to accommodate such arrangement, too much space is required and during the manufacturing using chips technology at least three diffusion steps are necessary in addition to the masking and etching steps. Consequently, the reliability and operation safety of such circuits is low.

By inserting coupling diodes into the outputs which eliminate the necessity for the input resistors at the base of the transistors, the electrical properties and the manufacturing steps may be improved.

However, in order to reduce the switching time of the logic system, it becomes necessary to shunt the coupling diodes with capacitive structural elements of a predetermined magnitude in order that the charge could be quickly removed from the base region of a successive transistor.

If using the above arrangement when a large number of outputs is necessary, then the semiconductor operational block requires a correspondingly larger space which is not readily available at all times. If an attempt is made to crowd the structural elements into a limited space, then disturbances become unavoidable in the circuit arrangement, adding further to the unreliable operation.

SUMMARY OF THE INVENTION

The object of the present invention is to provide an improved and economical manufacturing and application of a circuit arrangement having semiconductor functional elements therein.

It is another object of the invention to provide a circuit arrangement with semiconductor elements capable of performing logic operations at increased switching speeds, with high reliability at a reduced number of structural elements or operating regions within the structural elements.

It is still a further object of the invention to produce the above circuit arrangement requiring less operational space than similar prior art devices.

In accordance with the invention, a plurality of transistors operating with their collectors and emitters joined in a common nodal point, respectively, and having their bases individually driven, having their collectors connected to an inversely operated multiemitter-transistor, the base of which is supplied through a resistor and the emitters of which terminate in individual output circuits.

Briefly, a multiemitter-transistor, transistor is used in which the emitters are surrounded by highly doped frame regions in order to create a lateral transistor effect. These frame regions are connected with the collector (FIG. 2) of the multiemitter-transistor Should there be the attainable object the production of extremely fast switching characteristics, then one or more of the outputs are connected over an active or passive structural element which may also be arranged in any desired combination and which structural elements connect the outputs to the nodal point to which the collectors of the transistors are joined.

With this switching arrangement a reduced number of structural elements is able to attain a high switching speed which is further enhanced by the use of the multiemitter-transistor having lateral transistor effect. These advantages can be attained without any additional structural expenses. The energy consumption is low, consequently, the parasitic capacitances will diminish due to the joining of all collectors and to the fact that there will be only one insulated region present in the several transistor and the multiemitter-transistor combination.

Therefore, the space requirement becomes low and the only additional insulated region mentioned above will be needed for the sole resistor element which has a small valve anyway.

Due to the fact that the characteristic lines of the base-emitter paths of the multiemitter-transistor are nearly the same due to uniform manufacturing process and adjoining location, there will be no current hogging effects in the logic systems according to the invention.

The basic circuit in accordance with the invention will be capable to be used in the performance of logic functions such as OR-NOT and NOT. Further functions, such as, AND or "-flip-flops" or "half-adders," and semiconductor storage elements such as "scratchpads" can be made up by using several of the basic circuits in accordance with the invention operated at high switching speeds.

BRIEF DESCRIPTION OF THE DRAWING

The invention will become more readily apparent from the following description of a preferred embodiment thereof shown, by way of example, in the accompanying drawing in which.

DESCRIPTION OF THE PREFERRED EMBODIMENT

Figure 1:
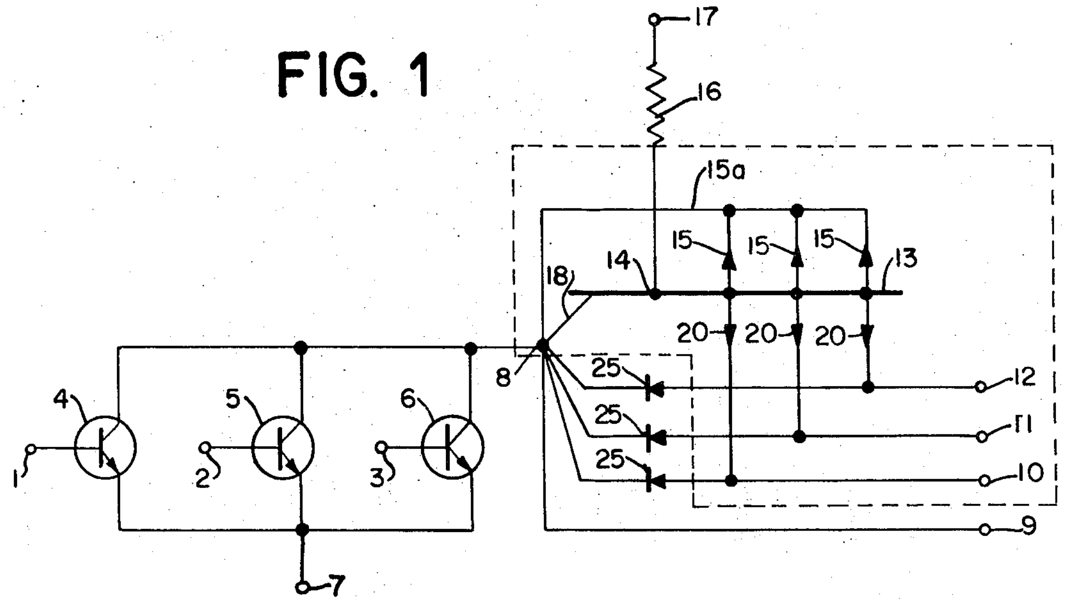
FIG. 1 is a circuit diagram of the transistor and multiemitter-transistor combination in accordance with the invention.

Referring to FIG. 1, it is seen that inputs 1, 2 and 3 lead to the bases of the input transistors 4, 5 and 6 which are connected in parallel and perform as well the coupling as the inversion operation. The collectors of the input transistors 4, 5 and 6 and the collector 18 of the lateral transistor arrangement of the multiemitter-transistor 13 operating as an emitter due to the inversely operating properties of the multiemitter-transistor 13, are interconnected in nodal point 8. A terminal 9 is connected also to nodal point 8 in order to connect to this point further input transistors in parallel, should there be need for such additional units. The emitters of the input transistors 4, 5 and 6 are connected to a common terminal 7. The supply voltage 17 is fed through a resistor element 16 to the base 14 of the multiemitter-transistor 13. Emitters 20 of the multiemitter-transistor 13 are connected respectively to outputs 10, 11 and 12, while emitters 15 of the lateral transistor arrangement of the multiemitter-transistor 13 are interconnected with its collector 18 through lead **15*a*. In order to further improve the switching operation, the outputs 10, 11 and 12 are each connected to the nodal point 8 through diodes 25**.

Should there be a "1"-signal fed to one of the inputs 1, 2 or 3, then the input transistor receiving such input signal will become conductive. Then the operating or lead resistance for the input transistors 4, 5 or 6 will be the series connection formed by the resistor element 16 and by the collector-base diode with the parallel lying emitter-base diode of the lateral transistor arrangement of the inversely operating multiemitter-transistor 13. The voltage between the base 14 and the terminal 7 is the sum of the saturation voltage of the input transistors 4, 5 or 6, that is, the voltage between the terminal 7 and the nodal point 8 and the operating voltage of the collector-base path with the parallel emitter-base path of the lateral transistor arrangement of the inversely operated multiemitter-transistor 13 that is the voltage between its base 14 and the nodal point 8. The outputs 10, 11 and 12 will be approximately at the same potential as the nodal point 8 when they are loaded with similar circuits. Since the input voltage of the successive circuits will be of the same magnitude as the rest voltage of the preceding stage, the transistors of the successive stages will be reliably cut off.

Should the inputs, 1, 2 or 3 receive a "O" signal, then the transistors 4, 5 or 6 will be cut off. Consequently, there will be no current flowing through the collector-base diode of the multiemitter-transistor 13. The current flows from the supply voltage 17 through the resistor element 16 and through the emitter-base diode of the multiemitter-transistor 13 to the corresponding output and from there to the input of the successive similar circuit, and from there to the corresponding emitter-base diode of the input transistors. Thereby the input transistors of the successive stage will become conductive and a collector current may flow.

For the linearization of the input characteristics of the successive stages the emitter-base diodes of the multiemitter-transistor 13 are utilized.

Should the circuit of FIG. 1 return to its original state, i.e., a "1" signal at one of the inputs 1, 2 or 3, then the charge from the base region of the transistors of the successive similar stages will be quickly removed through the inversely operating multiemitter-transistor 13 having the parallel lateral transistor effect and these stages will be able to perform a quick switching operation.

Figure 2:
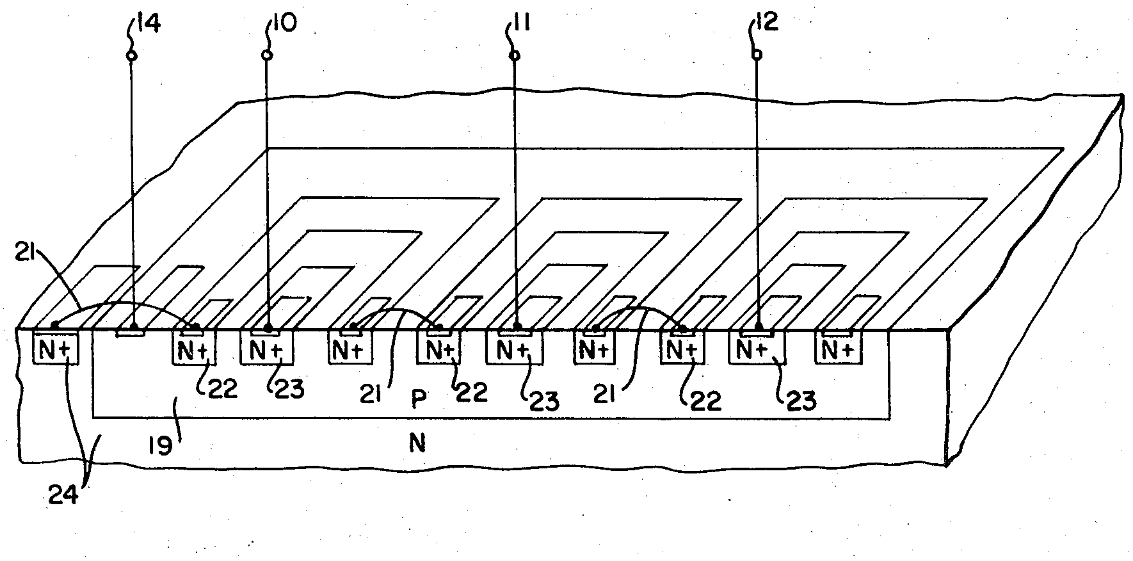
FIG. 2 is a perspective view in section of an integrated multiemitter-transistor.

Referring to FIG. 2 in the lateral transistor arrangement regions N+ of the highly doped frame regions 22 operate as emitters 15, P-region 19 operating as base 14 and the N+ regions 23 operating as collectors, while in the vertical transistor arrangement the N+ regions 23 will operate as emitters 20 leading to the outputs 10, 11 and 12, the P-region 19 will operate as base 14 and the N+ region 24 will operate as collector 18. The N+ region 24 is identical with nodal point 8 and is connected through leads 21 identical with lead 15*a* of FIG. 1 with the N+ or the high doped frame regions 22 into an electric circuit.

The input transistors 4, 5 and 6 are formed in the N—N+ regions 24 and the resistor element 16 is positioned during the base or emitter diffusion process.

While the invention has been described in only one embodiment, it will be readily appreciated that any modifications thereof can readily be made, and it is therefore intended by the appended claims to cover all such modifications as fall within the true spirit and scope of the invention.

I claim:

1. A switching circuit for performing logic operations comprising a plurality of input transistor devices each having collector, emitter and base electrodes, said collector and emitter electrodes of said devices being connected in parallel circuit relationship, respectively, each of said base electrodes serving as an input to the respective transistor device, each of said collector electrodes serving as an output for the respective transistor device, a multitransistor device comprising a plurality of emitter electrodes, at least one collector electrode and a base electrode, said output collector electrodes of said input transistor devices being connected to the collector electrode of said multitransistor device, a source of operating potential connected to the base electrode of said multitransistor device, and output terminals connected in circuit relationship with the plurality of emitter electrodes of said multitransistor device.

2. A switching circuit as claimed in claim 1, wherein said multitransistor device is a multiemitter device having lateral transistor arrangement comprising conductivity regions forming emitter electrodes and regions of highly doped material surrounding said emitter electrodes of said multitransistor device.

3. A switching circuit as claimed in claim 2, including means interconnecting said emitter electrodes of said multitransistor device with said collector electrodes thereof.

4. A switching circuit as claimed in claim 1, wherein active or passive circuit elements are connected to at least one of said output terminals and returned to the collector electrode of said multitransistor device.

5. A switching circuit as claimed in claim 1, including an additional terminal for connecting further input transistor devices to the collector electrode of said multitransistor device.